(12) United States Patent
Song et al.

(10) Patent No.: US 7,750,555 B2
(45) Date of Patent: Jul. 6, 2010

(54) TRANSPARENT ELECTRODE AND PREPARATION METHOD THEREOF

(75) Inventors: Ki Yong Song, Seoul (KR); Jin Young Kim, Suwon-si (KR); Sung Hen Cho, Seoul (KR); Chang Ho Noh, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 873 days.

(21) Appl. No.: 11/557,239

(22) Filed: Nov. 7, 2006

(65) Prior Publication Data
US 2007/0181878 A1 Aug. 9, 2007

(30) Foreign Application Priority Data
Feb. 7, 2006 (KR) .................. 10-2006-0011545

(51) Int. Cl.
*H05B 33/04* (2006.01)
*H05B 33/10* (2006.01)

(52) U.S. Cl. .................. 313/503; 313/500; 313/506

(58) Field of Classification Search .......... 313/498–512
See application file for complete search history.

(56) References Cited

U.S. PATENT DOCUMENTS

| 7,332,213 B2 * | 2/2008 | Mimura et al. ............... 428/212 |
| 2002/0114596 A1 * | 8/2002 | Gaudiana et al. ............. 385/120 |
| 2006/0158482 A1 * | 7/2006 | Nakamura et al. ............. 347/45 |
| 2007/0273276 A1 * | 11/2007 | Ottermann et al. ........... 313/505 |

FOREIGN PATENT DOCUMENTS

WO WO 2004107467 A2 * 12/2004

* cited by examiner

*Primary Examiner*—Nimeshkumar D. Patel
*Assistant Examiner*—Anne M Hines
(74) *Attorney, Agent, or Firm*—Cantor Colburn LLP

(57) ABSTRACT

Disclosed herein is a transparent electrode featuring the interposition of a nano-metal layer between a grid electrode on a transparent substrate and an electroconductive polymer layer, and a preparation method thereof. The transparent electrode can be produced in a continuous process at high productivity and low cost and can be applied to various display devices.

16 Claims, 4 Drawing Sheets

TRANSPARENT ELECTRODE AND PREPARATION METHOD THEREOF

This non-provisional application claims priority to Korean Patent Application No. 10-2006-0011545, filed on Feb. 7, 2006, and all the benefits accruing under 35 U.S.C. §119(a), the disclosure of which is herein incorporated by reference in its entirety.

BACKGROUND OF THE INVENTION

1. Field of the Invention

The present invention relates to a transparent electrode and a preparation method thereof. More specifically, the present invention relates to a transparent electrode comprising a grid electrode and a conductive polymer layer with a nano-metal layer interposed therebetween on a transparent substrate, where the transparent electrode exhibits high optical transmittance and low resistance and can be produced at low production cost, and a preparation method thereof.

2. Description of the Related Art

An electrode, which is generally constructed of a transparent conductive film formed on a transparent substrate, is used in a broad variety of devices requiring light transmission and electroconductivity, including image sensors, fuel cells, liquid crystal displays, organic electroluminescent ("EL") displays, touch screen panels, and the like.

With the commercialization of digital broadcasting, high-resolution large displays, of which flat displays, such as liquid crystal displays ("LCDs") and plasma display panels ("PDPs"), are representative, have been in great demand and have been popularized. Recently, a digital multimedia broadcasting ("DMB") service, which is a digital radio transmission system for sending multimedia (radio, TV and datacasting) to mobile devices such as mobile phones, and which can operate via satellite ("S-DMB") or terrestrial ("T-DMB") transmission, has been introduced. In addition, ubiquitous computing is now possible. Under these circumstances, increasing attention has been paid to flexible displays, which are now regarded as the next-generation display to succeed thin film transistor LCD ("TFT-LCD"), PDP and organic EL displays.

Flexible displays may be realized based on the principles of conventional displays with the modification that a glass substrate is replaced with a flexible substrate, or a switching device is replaced with the organic semiconductor organic thin film transistor ("OTFT"). Alternatively, flexible displays may be embodied as e-paper, microcapsule electrophoretic displays, and twist-ball displays.

In various displays including flexible displays, indium tin oxide ("ITO") electrodes have predominated over other electrodes due to the ability of ITO to be formed into a thin film on glass substrates and to the excellent light transmittance and electroconductivity of the ITO. For the preparation of ITO electrodes, a vacuum evaporation apparatus is generally used to deposit the ITO. Most vacuum evaporation apparatuses employ a sputtering process. When used to prepare a transparent electrode, a sputtering process can use a temperature of 200° C. and, in extreme cases, as high as 400° C. However, silicon substrates of transparent electrodes for LCDs or image sensors may not be able to endure such high temperatures. Specifically, the preparation of flexible displays cannot be conducted at such high processing temperatures, as such temperatures can cause the display substrate to deform. In addition, ITO electrodes suffer from the disadvantage of decreased durability when applied to flexible displays.

BRIEF SUMMARY OF THE INVENTION

Accordingly, the present invention has been made keeping in mind the above problems occurring in the prior art, and a transparent electrode is provided which exhibits high optical transmittance and low resistance and can be produced at low production cost. Also provided is preparation method thereof.

A method of preparing a transparent electrode at low cost and with ease is also provided.

In a further embodiment a display device comprising the transparent electrode is provided.

In order to accomplish the above, an in an embodiment, a transparent electrode, comprises: a transparent substrate; a grid electrode disposed on a surface of the transparent substrate; a nano-metal layer disposed on a surface of the grid electrode opposite the substrate; and an electroconductive polymer layer disposed over a surface of nano-metal layer opposite the grid electrode.

In the transparent electrode, the substrate may be an inorganic substrate made from glass or quartz, or a plastic substrate made from an organic compound selected from a group consisting of polyethylene terephthalate ("PET"), polyethylene naphthalate ("PEN"), polyethylene sulfone ("PES"), polycarbonate, polystyrene, polypropylene, polyester, acrylic resin, olefin maleimide copolymers, and norbornene resins.

In an exemplary modification of the transparent electrode, the nano-metal layer is made from one selected from the group consisting of palladium, nickel, copper, platinum, gold and alloys thereof, and has a metal particle size ranging from 3 to 40 nm.

In the transparent electrode, the electroconductive polymer layer is made from an electroconductive polymer selected from the group consisting of aniline-based homo- or copolymers, pyrrole-based homo- or copolymers, and vinylpyridine-based homo- or copolymers.

In order to accomplish the above, a method of preparing a transparent electrode is provided, comprising: constructing a grid electrode on a transparent substrate; forming a nano-metal layer containing metal nanoparticles over the grid electrode; and layering an electroconductive polymer over the nano-metal layer.

In order to accomplish the above a display device comprising the transparent electrode is provided.

BRIEF DESCRIPTION OF THE DRAWINGS

The above and other features and advantages of the present invention will be more clearly understood from the following detailed description taken in conjunction with the accompanying drawings, in which.

DETAILED DESCRIPTION OF THE INVENTION

Figure 1:
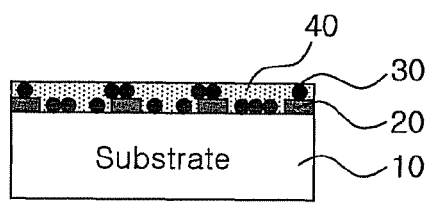
FIG. 1 is a schematic cross sectional view showing an exemplary transparent electrode according to an embodiment.

Below, a detailed description is given of the present invention with reference to the accompanying drawings.

It will be understood in the following disclosure of the present invention, that as used herein, the singular forms "a", "an" and "the" are intended to include the plural forms as well, unless the context clearly indicates otherwise. It will be further understood that the terms "comprise", "comprises", and "comprising," when used in this specification, specify the presence of stated features, integers, steps, operations, elements, components, and combination of the foregoing, but do not preclude the presence and/or addition of one or more other features, integers, steps, operations, elements, components, groups, and combination of the foregoing.

It will be understood that when an element is referred to as being "on" another element, or when an element is referred to as being "disposed between" two or more other elements, it can be directly on (i.e., in at least partial contact with) the other element(s), or an intervening element or elements may be present therebetween. In contrast, when an element is referred to as being "disposed on" another element, the elements are understood to be in at least partial contact with each other, unless otherwise specified. Spatially relative terms, such as "between", "in between" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees, inverted, or at other orientations) and the spatially relative descriptors used herein interpreted accordingly. Likewise, use of the term "opposite", unless otherwise specified, means on the opposing side or surface of the element. For example, where a surface of a layer is said to be opposite another surface or element, it is located on the opposing surface of the layer coplanar with the first surface unless otherwise specified.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Thus, a transparent electrode is disclosed which has a structure in which a nanometal layer and a conductive polymer layer are formed sequentially, on a transparent substrate on which a grid electrode is formed. The transparent electrode exhibits low resistance without a decrease in optical transmittance.

With reference to FIG. 1, the transparent electrode is schematically shown in a cross sectional view. As seen in FIG. 1, the transparent electrode comprises a substrate 10, a grid electrode 20 disposed on a surface of the substrate 10, a nano-metal layer 30 disposed on a surface of the grid electrode 20 opposite the substrate 10, and an electroconductive polymer layer 40 disposed over a surface of the nano-metal layer 30 opposite the grid electrode 20.

The composition of the substrate 10 is not particularly limited, as long as it is transparent. For example, a transparent inorganic substrate, such as that made from quartz or glass, or a transparent plastic substrate, such as that made from polyethylene terephthalate (PET), polyethylene naphthalate (PEN), polyethylene sulfone (PES), polycarbonate, polystyrene, polypropylene, polyester, acrylic resin, olefin maleimide copolymer, or norbornene resin, may be used. A substrate made from an olefin maleimide copolymer or a norbornene resin is useful where heat resistance is required; otherwise, a substrate made from a polyester film or an acryl resin can be used.

The grid electrode 20 (also referred to herein as a "metal mesh layer") is formed on a surface of the transparent substrate, and may be prepared using a method such as a screen printing method, an inkjet printing method, a dispensing method, a bubble jet method, a photocatalytic method, or a heat evaporation method.

When using a photocatalytic method, a grid electrode 20 may be prepared as follows. First, a photocatalyst compound is applied to substrate 10 to form a photocatalyst film, which is then coated with a water-soluble polymer layer. The photocatalyst film and the water-soluble polymer layer are together selectively exposed to light to afford a latent pattern of nuclei for crystal growth. After plating and forming the latent pattern of nuclei for crystal growth with metal, the metal is allowed to grow, to provide a grid electrode 20.

The nano-metal layer 30 may be made from a material selected from a group consisting of palladium, nickel, copper, platinum, gold, and alloys thereof. In an embodiment, the nano metal particles constituting the nano-metal layer have an average diameter of 3 to 40 nm.

Positioned between the grid electrode 20 and the electroconductive polymer layer 40, the nano-metal layer 30 can improve the electroconductivity of the transparent electrode by capturing charges. In addition to contributing to the improvement of electroconductivity, the metal particles of the nano-metal layer 30 do not degrade the transparency of the transparent electrode because they are smaller than visible wavelengths (i.e., the wavelengths of visible light) transmitted through the transparent electrode. Therefore, the transparent electrode thus features high optical transmittance and low electrical resistance.

As long as it is electroconductive, any polymer may be used as the material for the electroconductive polymer layer 40. In an embodiment, useful electroconductive polymers include aniline-based homopolymers or copolymers, pyrrole-based homopolymers or copolymers, and vinylpyridine-based homopolymers or copolymers, but are not limited thereto.

Specifically, exemplary electroconductive polymers include poly-3-hexylthiophene, polypyrrole, polysiloxane carbazole, polyaniline, (poly(1-methoxy-4-(O-disperse red 1))-2,5-phenylen-vinylene), polyindole, polycarbazole, polypyridiazine, polyisothianaphthalene, polyphenylene sulfide, polypyridinevinylene, and polypyridine.

In another embodiment, a method for preparing the transparent electrode is also disclosed. The method comprises constructing a grid electrode on a transparent substrate, applying a nano-metal layer containing metal nanoparticles over the grid electrode, and forming an electroconductive polymer layer on the nano-metal layer.

Figure 2:
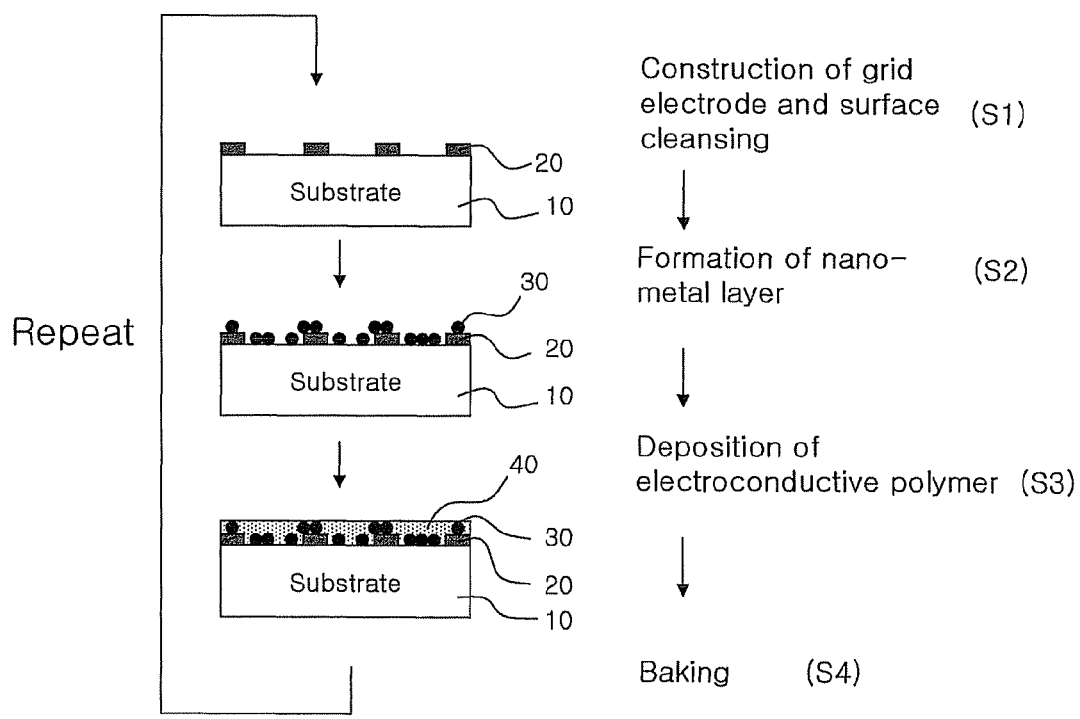
FIG. 2 is a flow chart illustrating an exemplary method of preparing the transparent electrode according to an embodiment.

With reference to FIG. 2, a process flow for the preparation of the transparent electrode is illustrated. Below, the preparation processes will be stepwise described in more detail referring to FIG. 2. The materials used in each step (S1 to S4 as shown in FIG. 2) are the same as described above.

i) Construction of Grid Electrode

In an embodiment, in FIG. 2, the grid electrode 20 is prepared according to step S1. Particular limitations are not imposed on the construction of the grid electrode 20. For example, methods such as a screen printing method, an inkjet printing method, a dispensing method, a bubble jet printing method, a photocatalytic method, or a heat evaporation method may be used for constructing the grid electrode 20.

When using a photocatalyst, a substrate 10 is coated with a photocatalyst compound to form a photocatalyst film, on which a water-soluble polymer is then applied, followed by selectively exposing the photocatalyst film and the water-soluble polymer layer to light to afford a latent pattern of nuclei for crystal growth. After plating the latent pattern of nuclei with metal, the induction of crystal growth on the plated metal yields a grid electrode 20.

The photocatalyst film is inactive before exposure to light, but becomes reactive after exposure to light. In the exposed region of the photocatalyst film, electron excitation occurs, inducing activity such as reductivity. When the photocatalyst film is selectively exposed by patterning through a photomask, only the exposed regions undergo reduction of the exposed metal ions, such as copper, platinum, palladium, and the like, enabling a metal pattern to be formed.

As such a photocatalyst compound, a Ti-containing organic compound capable of forming transparent $TiO_2$ through heat treatment may be used. Detailed examples of the organic compound include tetraisopropyltitanate, tetra-n-butyl titanate, tetrakis(2-ethyl-hexyl)titanate, and polybutyltitanate, but are not limited thereto.

Using a spin coating method, a spray coating method, or a screen printing method, a solution of the photocatalyst compound in a proper solvent, such as isopropyl alcohol, can be applied to a substrate.

Thereafter, the coating thus formed is heated to 200° C. or less for 20 min or shorter on a hot plate or in a convection oven to form a photocatalyst layer.

This photocatalyst layer is coated with a water-soluble polymer compound. Specifically, a water-soluble polymer compound is dissolved in a concentration of 2~30 wt % in water, and the solution is layered on the photocatalyst layer using a known coating method and heated to form a water-soluble polymer layer.

Upon subsequent UV exposure, the water-soluble polymer layer acts to accelerate photoreduction, thereby improving the photocatalytic activity. A useful water-soluble polymer may be a homo- or co-polymer of polyvinyl alcohol, polyvinyl phenol, polyvinyl pyrrolidone, polyacrylate, polyacrylamide, gelatin, and the like.

The composite structure comprising the photocatalyst film and the water-soluble polymer layer is then selectively exposed using the above-described exposure/photomask process to form a photocatalyst pattern which will act as a nucleus for the crystalline growth of metal which is subsequently plated thereon. Depending on the kind of photocatalyst compound that is used, desirable conditions for the UV exposure, such as exposure atmosphere, dosage, and the like, can be properly selected.

When the latent pattern of the nuclei for crystal growth, having metal particles deposited thereon or not, is plated with metal, metal crystals are grown on the nuclei to realize a grid electrode pattern.

The properties of the transparent electrode, including transparency, flexibility, mechanical strength, and the like, of the grid electrode pattern, can be adjusted with respect to line width, density, and other relevant electrode features.

ii) Formation of Nano-Metal Layer

In an embodiment, also in FIG. 2, the nano-metal layer 30 is prepared according to step S2. For the formation of a nano-metal layer, the grid electrode 20 is immersed for a predetermined period of time in a colloidal suspension of metal nano-particles, and is dried.

The colloidal suspension of the metal nano-particles may be prepared using a known method. For example, a metal nanoparticle solution can be combined with organic protective colloids and mixed with a reducing solution. The organic protective colloids serve to stabilize the metal nanoparticle solution against unfavorable aggregation of metal nanoparticles.

Economy dictates that water is desirable as a solvent for the colloidal suspension. Optionally, the metal nanoparticles can be dissolved in an aqueous solution in an amount proportional to the amount of organic solvent. The metal colloidal suspension has a metal concentration of 50 mg/l to 1,000 mg/l.

In order to stabilize the colloidal suspension to be prepared, an organic compound is used as a protective colloid. A water-soluble polymer, whether ionic or non-ionic, is useful as a protective colloid. Examples of organic protective colloids useful in the preparation of the metal nanoparticle solution include naturally occurring polymers, such as proteins, peptides, polysaccharides, gelatin, agar, gum arabic, tannin, and the like, and synthetic polymers, such as alkylcellulose, hydroxyalkylcellulose, polyvinyl pyridine, pyrrolidone, methylethyl ketone, alcohols, acetate, polyamine, polyacrylate, polyacrylamide, polyacrylate, polyethylene glycol copolymers, derivatives thereof, and combinations thereof. In an embodiment, the organic compound is polyvinyl pyrrolidone. In a specific embodiment, the organic compound is poly(4-vinylpyrrolidone).

A reducing agent is used for reducing metal compounds (e.g., palladium compounds) to metal particles (e.g., palladium). Examples of useful reducing agents include: alkali metal borate hydroxide; metal hypophosphite; alkali metal phosphate; phosphoric acid; formic acid; formaldehyde; hydrazine and salts and derivatives thereof, such as hydrazine hydrate, hydrazine sulfate, formate, dichlorate, mononitrate, monochlorate, oxalate, hypophosphite, phosphate, orthophosphate, and tartrate and derivatives of these salts, 1,1-dimethyl hydrazine, 1,2-dimethyl hydrazine, methyl hydrazine, ethyl hydrazine, phenyl hydrazine, isopropyl hydrazine and its hydrochloride and hydrozoethanic acid salts, and derivatives such as hydroxylamine and alpha- and beta-hydroxylamine.

The preparation of a metal nanoparticle colloid starts with the mixing of a solution of metal nanoparticles with a reducing agent solution. The mixture is then heated to 50 to 70° C., optionally followed by the addition of further reducing agent thereto. Afterwards, the substrate with the grid electrode formed thereon is immersed in the metal nanoparticle colloid for 5 to 15 min., washed with deionized water, and dried.

iii) Formation of Electroconductive Polymer Layer

In an embodiment, also in FIG. 2, the electroconductive layer 40 is prepared according to step S3. Over the metal nanoparticle layer 30 is formed an electroconductive polymer layer 40 for which an electroconductive polymer selected from among aniline-based homopolymers or copolymers, pyrrole-based homopolymers or copolymers, and vinylpyridine-based homopolymers or copolymers may be used. Concrete example of the electroconductive polymer include poly-3-hexylthiophene, polypyrrole, polysiloxane carbazole, polyaniline, (poly(1-methoxy-4-(O-disperse red 1))-2,5-phenylen-vinylene), polyindole, polycarbazole, polypyridiazine, polyisothianaphthalene, polyphenylene sulfide, polypyridinevinylene, and polypyridine.

For applying a solution of the electroconductive polymer, methods such as a spray method, a spin coating method, a dipping method, a printing method, a doctor blading method, a sputtering method, or an electrophoretic method, may be used.

Solvents for the electroconductive polymer solution include chloroform, N-methylpyrrolidone, acetone, cyclopentanone, methylethylketone, ethylcellosolve acetate, butylacetate, ethylene glycol, toluene, xylene, tetrahydrofuran, dimethylformamide, chlorobenzene, or acetonitrile, where these solvents may be used alone or in combination.

Further, in FIG. 2, after deposition of the electroconductive layer, the transparent electrode is completed by baking as shown in step S4. In this way, the transparent electrode is formed.

Also in FIG. 2, the procedure for preparing the transparent electrode may be repeated to form a multilayer transparent electrode. The electrode, even if formed to have a multilayer structure, is transparent enough to ensure superior transparency and electroconductivity for various displays.

Therefore, the transparent electrode can be used for applications in various display devices, including image sensors, fuel cells, LCDs, organic EL displays, touch screen panels, and the like.

A better understanding of the present invention may be realized with the following examples, which are set forth to illustrate, but are not to be construed to limit the present invention.

Example 1 i) Preparation of Grid Electrode and Surface Treatment

A solution of polybutyl titanate in isopropanol (2.5 wt %) was applied to a transparent polyester film with the aid of a spin coater and dried at 150° C. for 5 min to form a titanium dioxide coating 100 nm thick. To a 5 wt % aqueous solution of polyvinyl alcohol having a weight averaged molecular weight of 25,000 (commercially available from Polyscience), triethanol amine, serving as a photosensitizer, was added in an amount of 1 weight part based on 100 weight parts of the polymer. After being mixed well, the solution was layered on the titanium dioxide coating and dried at 60° C. for 2 min. The photocatalytic film thus obtained was exposed to UV light having a broad range of wavelengths, through a photomask with a micropattern formed therein (using a UV instrument from Oriel U.S.A.). Following UV exposure, the photocatalytic film was immersed in a solution of 0.6 g of $PdCl_2$ and 1 ml of HCl in 1 liter of water, to deposit Pd metal particles in the exposed regions, thereby producing a substrate in which a Pd-deposited pattern of nuclei for crystal growth was formed.

The substrate was immersed for 10 min in an electroless copper plating solution ($CuSO_4H_2O$ 12 g, $KNaC_4H_4O_6 \cdot H_2O$ 55 g, NaOH 18 g, $Na_2CO_3$ 10 g, $Na_2S_2O_3 \cdot H_2O$ 0.0002 g, $CH_2O$ (40 wt % aqueous solution) 20 ml, water 1 liter) to obtain a copper wire pattern.

The transparent substrate on which the grid electrode was formed was cleaned by immersion for 1 min at 20° C. in a solution of 3 ml of $H_3PO_4$ in 1 liter of deionized water (pH=2.0).

ii) Formation of Nano-Metal Layer $H_2PdCl_4$ (0.0887 g) and polyvinylpyrrolidone ("PVP") (0.8325 g) were added to 75 ml of deionized water containing 65 ml of formaldehyde (40 wt % aqueous solution) as a reducing agent. Subsequently, 10 ml of 0.1 M methanolic NaOH was added, followed by mixing the solution for 3 hours to prepare a colloid of palladium nanoparticles.

The surface-treated substrate obtained in the previous step was immersed for 5 min in the colloidal suspension of Pd nanoparticles, washed with deionized water, and dried at 80° C. for 1 hour to form a film of Pd nanoparticles having a thickness of 10 nm.

iii) Formation of the Electroconductive Polymer Layer

Over the palladium nanoparticle-coated thin film was formed an electroconductive polymer layer. For formation thereof, the conductive polymer PVPCH 8000 (a blend of poly(3,4-ethylenedioxythiophene) and poly(styrenesulfonate), commercially available from Bayer), was dispersed (5 wt % dispersion) in deionized water, applied using a spin coater, and dried at 150° C. for 1 hour to form a film of conductive polymer having a thickness of 50 nm.

Figure 3A:
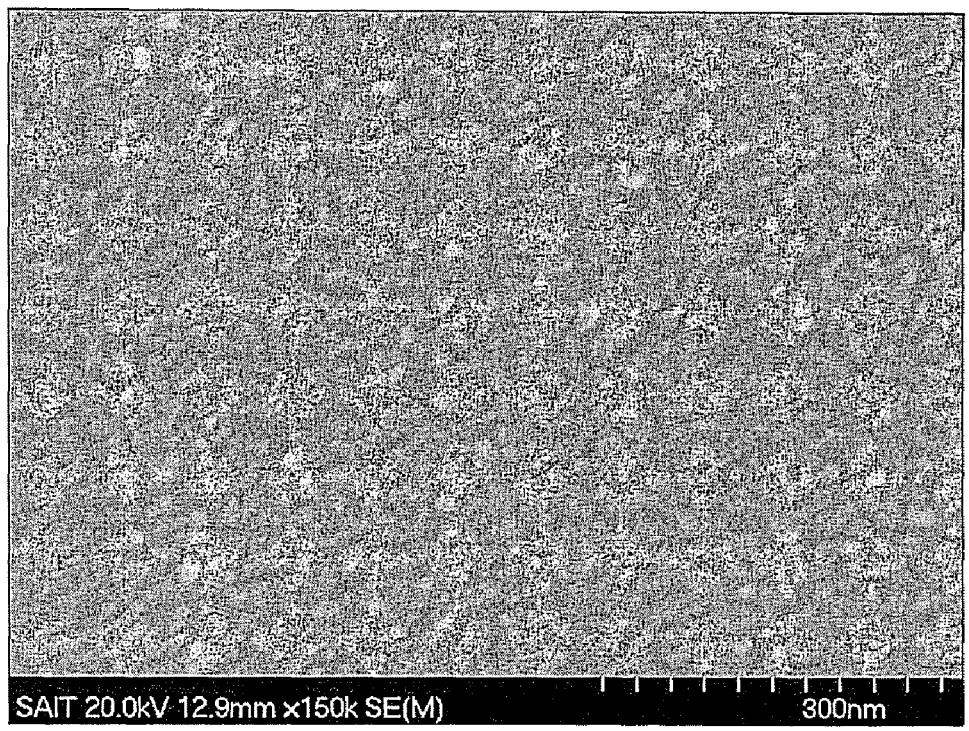
FIGS. 3a and 3b are SEM photographs of an exemplary transparent electrode prepared in Example 1.
Figure 3B:
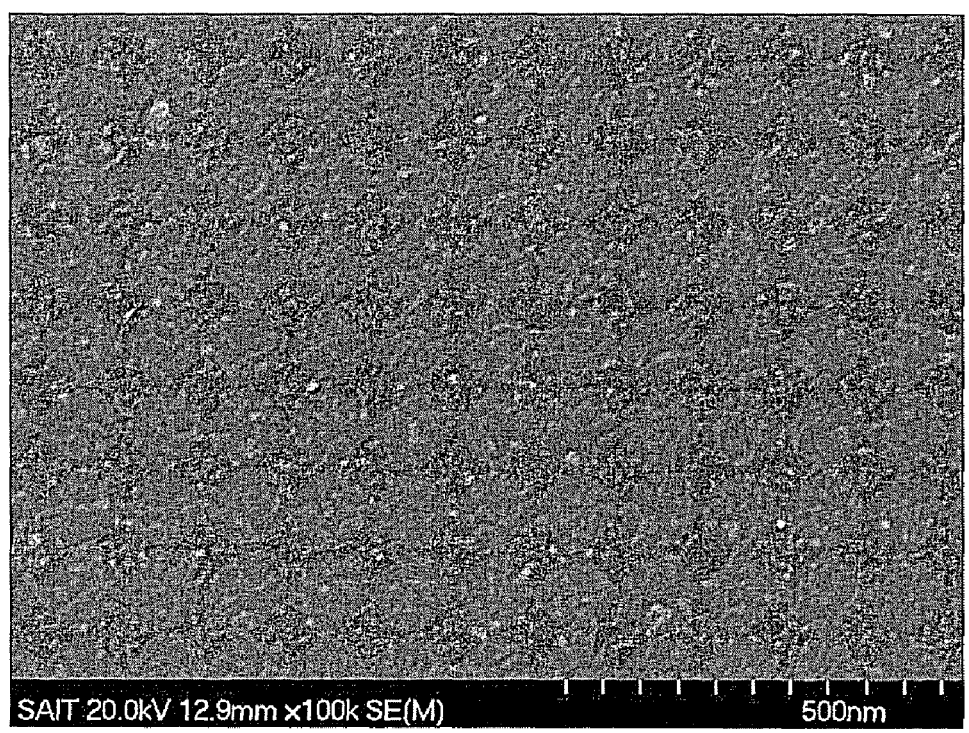

With reference to FIG. 3a, the transparent electrode having the nano-metal layer formed therein, obtained in Example 1, is shown in a SEM photograph, and FIG. 3b is a magnification of FIG. 3a. As seen in FIGS. 3a and 3b, metal nanoparticles about 10 nm in average size were uniformly distributed over the entire surface of the transparent electrode.

Comparative Example 1

A transparent electrode was prepared in the same manner as in Example 1, with the exception that an electroconductive polymer layer was formed directly over a grid electrode without the interposition of a nano-metal layer therebetween.

The transparent electrodes prepared in Example 1 and Comparative Example 1 were evaluated for optical transmittance and sheet resistance according to the following methods, and the results are graphically depicted in FIGS. 4a-4b and 5a-5b.

Evaluation of Transparent Electrode for Physical Properties (1) Measurement of Optical Transmittance Optical transmittance was measured using a UV-Visible spectrophotometer.

(2) Measurement of Sheet Resistance

Sheet resistance, reported in units of ohms per square ($\Omega/\square$) was measured according to a four-point probe method.

Figure 4A:
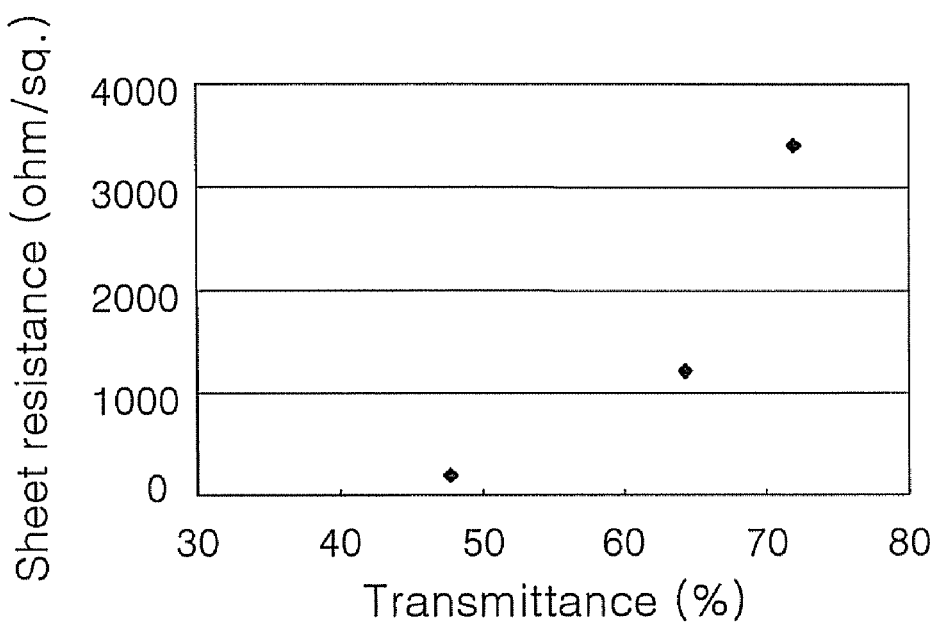
FIGS. 4a and 4b are graphs in which resistance changes of the exemplary transparent electrodes prepared in Example 1 and Comparative Example 1 are plotted against transmittance.
Figure 4B:
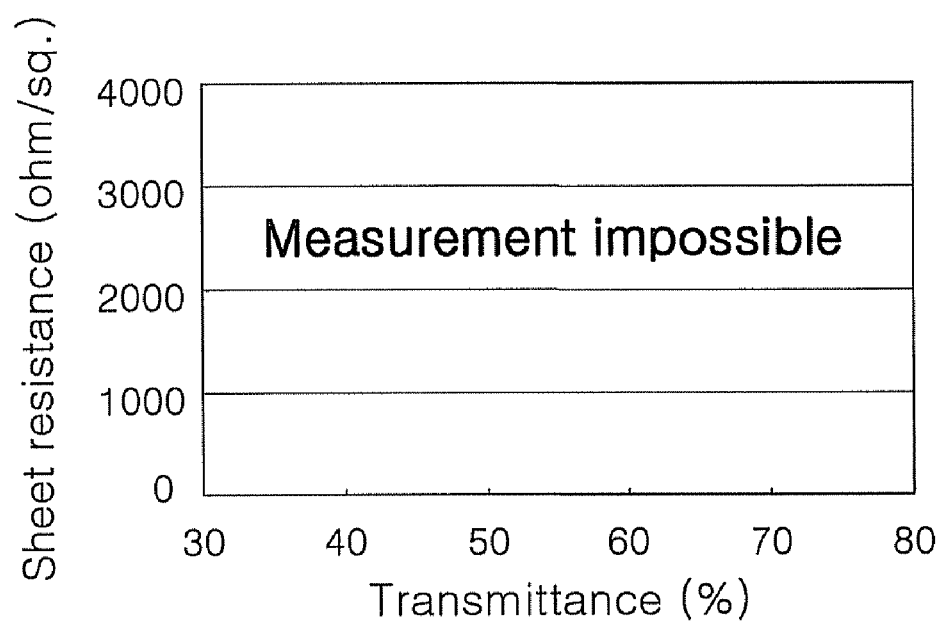

The transparent electrodes prepared in Example 1 and Comparative Example 1 were measured for sheet resistance according to the optical transmittance, and the results are shown in FIGS. 4a and 4b, respectively. As seen in FIG. 4a, the transparent electrode of the present invention has an optical transmittance of 65% or higher and a sheet resistance of 1,000$\Omega/\square$ or lower across the entire range, and thus it can be applied to various display devices, including image sensors, fuel cells, LCDs, and the like, ensuring superior properties thereof. In contrast, it is impossible to measure the sheet resistance of the transparent electrode prepared in Comparative Example 1, which has an electroconductive polymer layer directly on a grid electrode, because the electroactive polymer layer does not allow electricity to flow therethrough.

Figure 5A:
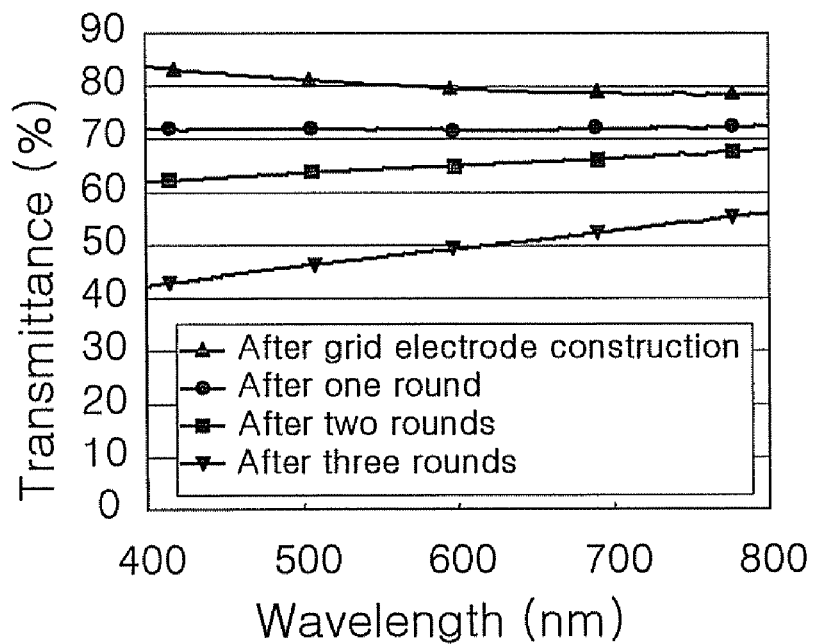
FIGS. 5a and 5b are graphs in which transmittance changes of the exemplary transparent electrodes prepared in Example 1 and Comparative Example 1 are plotted against wavelength.
Figure 5B:
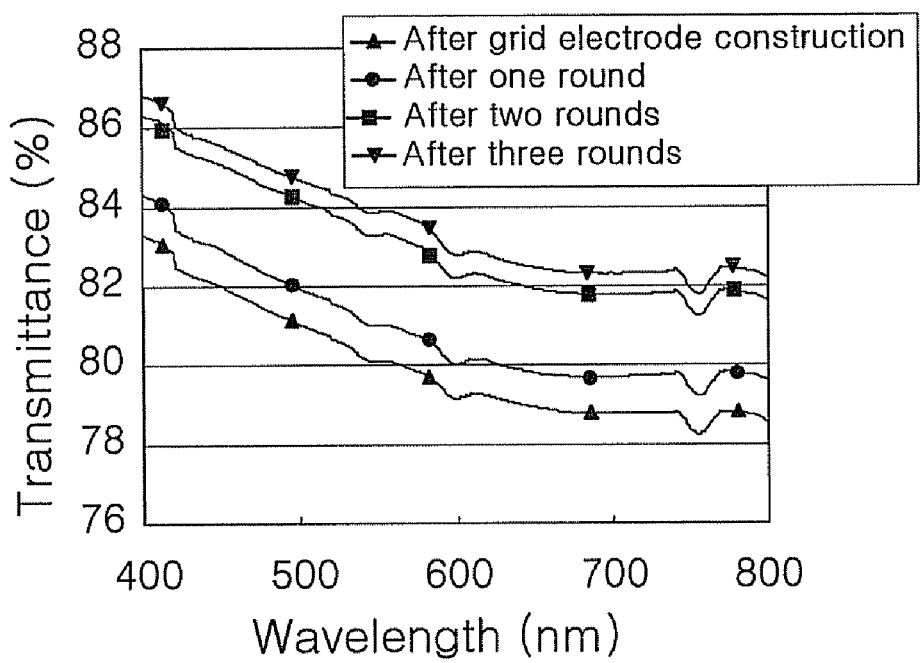

FIGS. 5a and 5b are graphs showing optical transmittances of the multilayer electrodes prepared by repeating the procedures of Example 1 and Comparative Example 1 plotted against wavelength for each repetition. Changes in optical transmittance according to wavelength are shown just after the formation of the grid electrode, after one round of the process (i.e., after deposition of a first sequential deposition of grid electrode, nano-metal layer, and electroconductive polymer layer), after two rounds of the process, and after three rounds of the process.

With high transmittance and low resistance, the transparent electrode disclosed herein can be applied to various display devices. In addition, the transparent electrode featuring high transmittance and low resistance in accordance with the present invention can be prepared at low production cost because it uses a simple plating process (wet process), rather than a sputtering process which requires use of expensive vacuum equipment.

Whereas a sputtering method is conducted at 200° C. or higher, the preparation method disclosed herein uses a temperature of 75° C. at the highest, and therefore can be applied for the preparation of flexible transparent electrodes for use in flexible display devices.

Further, the method of the present invention can be conducted in a continuous (roll-to-roll) process and employs a plating process, so that it can produce a large-area electrode which is uniform with respect to electricity conduction and transparency.

Although the embodiments of the present invention have been disclosed for illustrative purposes, those skilled in the art will appreciate that various modifications, additions and substitutions are possible. Accordingly, the modifications, additions and substitutions should be understood as falling within the scope and spirit of the invention.

What is claimed is:

1. A transparent electrode, comprising:
    a transparent substrate;
    a grid electrode disposed on a surface of the transparent substrate;
    a nano-metal layer disposed on a surface of the grid electrode opposite the transparent substrate; and
    an electroconductive polymer layer disposed over a surface of nano-metal layer opposite the grid electrode.

2. The transparent electrode as set forth in claim 1, wherein the substrate is an inorganic substrate made from glass or quartz, or a plastic substrate made from an organic compound selected from a group consisting of polyethylene terephthalate, polyethylene naphthalate, polyethylene sulfone, polycarbonate, polystyrene, polypropylene, polyester, acryl resin, olefin maleimide copolymers, and norbornene resins.

3. The transparent electrode as set forth in claim 1, wherein the nano-metal layer comprises one selected from a group consisting of palladium, nickel, copper, platinum, gold and alloys thereof.

4. The transparent electrode as set forth in claim 3, wherein the nano-metal layer has an average metal particle size of 3 to 40 nm.

5. The transparent electrode as set forth in claim 1, wherein the electroconductive polymer layer comprises an electroconductive polymer selected from the group consisting of aniline-based homo- or copolymers, pyrrole-based homo- or copolymers, and vinylpyridine-based homo- or copolymers.

6. The transparent electrode as set forth in claim 1, wherein the electroconductive polymer layer comprises an electroconductive polymer selected from a group consisting of poly-3-hexylthiophene, polypyrrole, polysiloxane carbazole, polyaniline, poly(1-methoxy-4-(O-disperse red 1))-2,5-phenylene-vinylene, polyindole, polycarbazole, polypyridiazine, polyisothianaphthalene, polyphenylene sulfide, polypyridinevinylene, and polypyridine.

7. A display device, comprising the transparent electrode of claim 1.

8. A method of preparing a transparent electrode, comprising:
    constructing a grid electrode on a transparent substrate;
    forming a nano-metal layer containing metal nanoparticles over the grid electrode; and
    depositing an electroconductive polymer layer over the nano-metal layer.

9. The method as set forth in claim 8, wherein the substrate is a transparent inorganic substrate made from glass or quartz, or is a transparent plastic substrate made from an organic compound selected from the group consisting of polyethylene terephthalate, polyethylene naphthalate, polyethylene sulfone, polycarbonate, polystyrene, polypropylene, polyester, acrylic resin, olefin maleimide copolymers, and norbornene resin.

10. The method as set forth in claim 8, wherein the nano-metal layer comprises one selected from the group consisting of palladium, nickel, copper, platinum, gold and alloys thereof.

11. The method as set forth in claim 10, wherein the nano-metal layer has an average metal particle size of 3 to 40 nm.

12. The method as set forth in claim 8, wherein the electroconductive polymer layer comprises an electroconductive polymer selected from the group consisting of aniline-based homo- or copolymers, pyrrole-based homo- or copolymers, and vinylpyridine-based homo- or copolymers.

13. The method as set forth in claim 8, wherein the electroconductive polymer layer comprises an electroconductive polymer selected from the group consisting of poly-3-hexylthiophene, polypyrrole, polysiloxane carbazole, polyaniline, poly(1-methoxy-4-(O-disperse red 1))-2,5-phenylene-vinylene, polyindole, polycarbazole, polypyridiazine, polyisothianaphthalene, polyphenylene sulfide, polypyridinevinylene, and polypyridine.

14. The method as set forth in claim 8, wherein the grid electrode is constructed using a process selected from the group consisting of a screen printing process, an inkjet printing process, a dispensing process, a bubble jet process, a photocatalytic process, and a heat evaporation process.

15. The method as set forth in claim 8, wherein the nano-metal layer is formed by immersing the grid electrode-constructed substrate in a colloidal suspension of metal nanoparticles and drying the substrate.

16. The method as set forth in claim 8, wherein the electroconductive polymer layer is formed by applying an electroconductive polymer over the grid electrode using a spraying, spin coating, dipping, printing, doctor blading, or sputtering process.

* * * * *